(12) United States Patent
Chen et al.

(10) Patent No.: US 8,403,433 B2
(45) Date of Patent: Mar. 26, 2013

(54) SLIDE ASSEMBLY WITH QUICK-MOUNT SYSTEM

(75) Inventors: Ken-Ching Chen, Kaohsiung (TW);
Shun-Ho Yang, Kaohsiung (TW);
Chun-Chiang Wang, Kaohsiung (TW)

(73) Assignee: King Slide Works Co., Ltd., Kaohsiung (TW)

( * ) Notice: Subject to any disclaimer, the term of this patent is extended or adjusted under 35 U.S.C. 154(b) by 19 days.

(21) Appl. No.: 13/238,068

(22) Filed: Sep. 21, 2011

(65) Prior Publication Data
US 2012/0106880 A1  May 3, 2012

Related U.S. Application Data

(60) Provisional application No. 61/409,180, filed on Nov. 2, 2010.

(51) Int. Cl.
*A47B 95/00* (2006.01)
(52) U.S. Cl. ........................................ 312/333
(58) Field of Classification Search .................. 312/333, 312/334.46, 334.44, 334.47; 384/21
See application file for complete search history.

(56) References Cited

U.S. PATENT DOCUMENTS

| 4,331,369 | A | * | 5/1982 | Lazar et al. | 384/23 |
|---|---|---|---|---|---|
| 6,209,979 | B1 | * | 4/2001 | Fall et al. | 312/330.1 |
| 6,588,866 | B2 | * | 7/2003 | Cheng | 312/334.7 |
| 6,948,691 | B2 | * | 9/2005 | Brock et al. | 248/222.13 |
| 7,382,623 | B2 | * | 6/2008 | Hartman | 361/726 |
| 7,481,504 | B2 | * | 1/2009 | Chen et al. | 312/333 |
| 7,513,581 | B1 | * | 4/2009 | Baiza et al. | 312/333 |
| 7,604,307 | B2 | * | 10/2009 | Greenwald et al. | 312/333 |
| 7,871,139 | B2 | * | 1/2011 | Yu et al. | 312/333 |
| 2003/0141791 | A1 | * | 7/2003 | Dubon et al. | 312/333 |
| 2004/0239221 | A1 | * | 12/2004 | Yang | 312/334.46 |

* cited by examiner

*Primary Examiner* — Hanh V Tran
(74) *Attorney, Agent, or Firm* — Rosenberg, Klein & Lee

(57) ABSTRACT

A slide assembly with quick-mount system includes an outer rail, an intermediate rail, an inner rail and a ball bearing retainer. The intermediate rail has a notch. The inner rail has a first slot and a second slot to accommodate first and second mounts of an installed member. The ball bearing retainer has an upper member and a bottom member. The upper and bottom members each have retaining sections. Each retaining section has a ball bearing. The distance between adjacent retaining sections is larger than the diameter of the first mount. When the inner rail is pulled out relative to the intermediate rail, the first slot is located corresponding to the notch and between any two of the retaining sections, the first mount extends through the notch and enters into the first slot to be positioned. The second mount is engaged with the second slot of the inner rail.

3 Claims, 5 Drawing Sheets

SLIDE ASSEMBLY WITH QUICK-MOUNT SYSTEM

REFERENCE TO RELATED APPLICATIONS

This Application is based on Provisional Patent Application Ser. No. 61/409,180, filed 2 Nov. 2010, currently pending.

FIELD OF THE INVENTION

The present invention relates to a slide assembly with quick-mount system, and more particularly, to a slide assembly with a quick-mount system which allows the exterior members to be quickly installed and firmly supported.

BACKGROUND OF THE INVENTION

U.S. Pat. No. 6,209,979 to Fall et al. discloses a "Telescoping slide with quick-mount system" and includes a three-stage slide assembly having a stationary slide 20, a chassis-support slide 24, and an intermediate slide 22 located between the stationary slide and the chassis-support slide. The intermediate slide has an opening (beside the reference 105) and the chassis-support slide has three L-shaped slots 16. A chassis 12 has three mounting posts 14 on a side wall thereof. When the chassis-support slide is pulled out relative to the intermediate slide to a pre-set position, as shown in FIG. 4, the opening of the intermediate slide is located corresponding to the slot close to the distal end of the chassis-support slide so that one of the mounting posts may extend through the opening of the intermediate slide and enters into the slot of the chassis-support slide to be positioned. The rest of the mounting posts of the chassis can be engaged with other slots of the chassis-support slide. By this way, the chassis is supported by the chassis-support slide. However, Fall et al. do not have bearings between the stationary slide, the chassis-support slide and the intermediate slide to assist the sliding actions therebetween. Therefore, significant friction exists between the slides so that the users have to take much effort to pull the slides.

U.S. Publication Patent No. 2007/0127856 to Young et al. discloses a "Drop-in ball bearing slide assembly" and includes a three-stage slide assembly having a stationary slide segment 310, an intermediate slide segment 330, a movable slide segment 350 and a ball bearing spacer 320 located between the stationary slide segment and the intermediate slide segment as shown in FIG. 4 so that the intermediate slide segment is movable along the stationary slide segment by the ball bearing spacer. A ball bearing retainer 340 is located between the intermediate slide segment and the movable slide segment. The stationary slide segment is installed to a rack frame 10 and the intermediate slide segment has an opening 339. The movable slide segment has a plurality of slots 360. A server 20 has a plurality of mounts 370 on a side wall thereof. The ball bearing retainer as shown in FIGS. 6A, 6C has a top elongate member 342, 342" and a bottom elongate member 344, 344". The length $L_2$ along the top elongate member has a plurality of first set of ball bearings 342a, 342a" located thereto, and the length $L_1$ along the bottom elongate member has a plurality of second set of ball bearings 344a, 344a" located thereto. Accordingly, an upper space is defined between the top and bottom elongate members, and the upper space is the portion equal to the $L_1$ minuses $L_2$. Alternatively, as shown in FIG. 6C, the top elongate member has an opening 349. When the movable slide segment is pulled out relative to the intermediate slide segment to a pre-set position as shown in FIGS. 7 and 8A-8C, the opening 339 of the intermediate slide segment is located corresponding to the opening 362 of the movable slide segment so that one of the mounts may extend through the opening of the intermediate slide segment and the upper space or opening of the upper elongate member of the ball bearing retainer to enter into the neck portion 364 of the slot of the movable slide segment to be positioned. The rest of the mounts of the server can be engaged with other slots of the movable slide segment. By this way, the server is supported by the movable slide segment and the ball bearings assist the movement of the server. However, Young et al. the ball bearing retainers can only be cooperated with special mounts of the server, once the size of the server changes, the upper space or opening of the ball bearing retainer has to be re-arranged. And this relates development of new molds which increase manufacturing cost. Even if the upper space of the ball bearing retainer has a longer length as shown in FIG. 6A, the support forces on the top and bottom of the ball bearing retainer are not even and this affects the load support of the slide assembly.

The present invention intends to provide a slide assembly with quick-mount system to mitigate the drawbacks of the existed slide assemblies.

SUMMARY OF THE INVENTION

The present invention relates to a slide assembly with quick-mount system, and comprises an outer rail and an intermediate rail slidably connected to the outer rail. The intermediate rail has a first wall, a second wall located corresponding to the first wall, and a third wall connected to the first and second walls. The first wall has a first bearing face and a first notch, the second wall has a second bearing face. At least one inner ball bearing set is located between the outer rail and the intermediate rail. An inner rail has a top wall, a bottom wall located corresponding to the top wall, and a side wall connected to the top and bottom walls. The top wall of the inner rail is located corresponding to the first bearing face of the first wall of the intermediate rail. The bottom wall of the inner rail is located corresponding to the second bearing face of the second wall of the intermediate rail. The top wall of the inner rail has a first slot and a second slot, each of the first and second slots extends to a portion of the side wall of the inner rail. An installed member at least has a first mount and a second mount. A ball bearing retainer has an upper member, a bottom member located corresponding to the upper member, and a connection member connected to the upper and bottom members. The ball bearing retainer has a length. The upper member has a plurality of spaced upper retaining sections located along the length direction of the ball bearing retainer. Each of the upper retaining sections at least has an upper ball bearing. The distance between any adjacent upper retaining sections is larger than a maximum diameter of the first mount of the installed member. The bottom member has a length corresponding to that of the upper member and has a plurality of spaced bottom retaining sections. Each of the bottom retaining sections is located along the bottom member and has a plurality of bottom ball bearings. The upper ball bearings are located between the top wall of the inner rail and the first bearing face of the intermediate rail. The bottom ball bearings are located between the bottom wall of the inner rail and the second bearing face of the intermediate rail. When the inner rail is pulled out relative to the intermediate rail to a extension position, the first slot of the inner rail is located corresponding to the first notch of the first wall of the intermediate rail and is located between any two of the upper retaining sections of the ball bearing retainer, so that the first mount of the installed member extends through the first notch of the intermediate rail and yields the ball bearing retainer and enters into the first slot of the inner rail to be positioned.

Preferably, the inner rail has a third slot which is located between the first and second slots. The installed member has a third mount located between the first and second mounts. The third mount is inserted into the third slot of the inner rail and positioned.

Preferably, the second wall of the intermediate rail has a second notch which is located corresponding to the first notch of the first wall.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
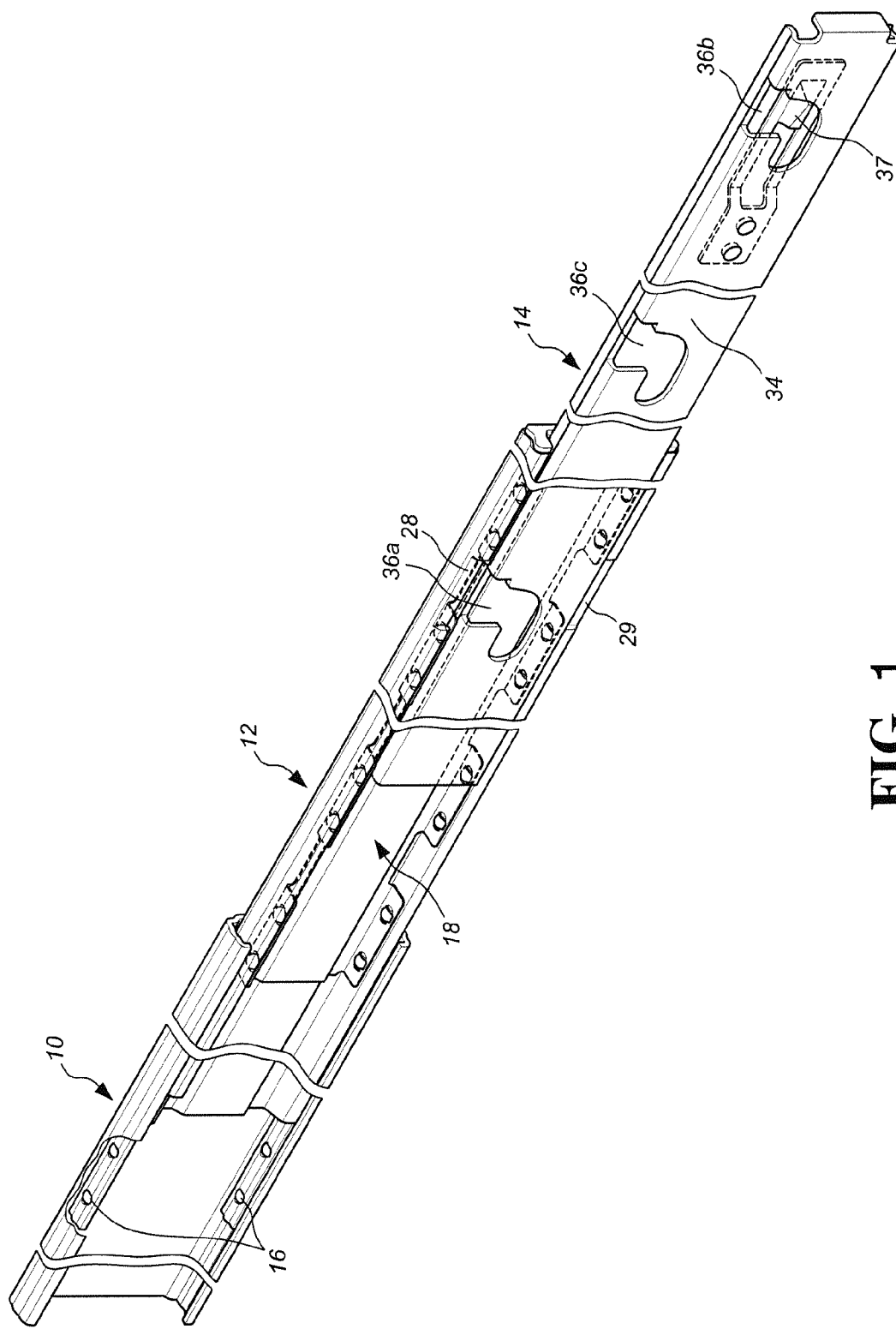
FIG. 1 is a perspective view to show the slide assembly of the present invention.
Figure 2:
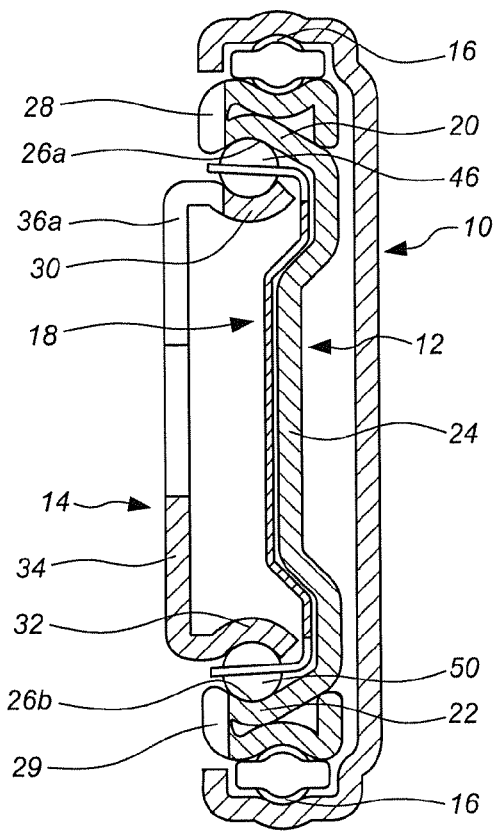
FIG. 2 is a cross sectional view of the slide assembly of the present invention.

Referring to FIGS. 1 and 2, the slide assembly of the present invention comprises an outer rail 10, an intermediate rail 12, an inner rail 14 and at least one inner ball bearing set 16 located between the outer rail 10 and the intermediate rail 12, and a ball bearing retainer 18 located between the intermediate rail 12 and the inner rail 14.

The outer rail 10 is installed and positioned to a rack.

The intermediate rail 12 is slidably connected to the outer rail 10 and has a first wall 20, a second wall 22 located corresponding to the first wall 20, and a third wall 24 connected to the first and second walls 20, 22. The first wall 20 has a first bearing face 26a. Preferably, the first wall 20 of the intermediate rail 12 has a first notch 28 and the second wall 22 has a second bearing face 26b which is located corresponding to the first notch 28 of the first wall 20. When the intermediate wall 12 is used, it is able to be used in both left and right sides.

The inner rail 14 has a top wall 30, a bottom wall 32 located corresponding to the top wall 30, and a side wall 34 connected to the top and bottom walls 30, 32. The top wall 30 of the inner rail 14 is located corresponding to the first bearing face 26a of the first wall 20 of the intermediate rail 12. The bottom wall 32 of the inner rail 14 is located corresponding to the second bearing face 26b of the second wall 22 of the intermediate rail 12. In a preferable embodiment, the top wall 30 of the inner rail 14 has a first slot 36a, a second slot 36b and a third slot 36c located between the first and second slots 36a, 36b. Each of the first, second and third slots 36a, 36b, 36c extends to a portion of the side wall 34 of the inner rail 14. Preferably, the inner rail 14 has an engaging member 37 which is able to be bent and returned relative to the inner rail 14, and the engaging member 37 is located corresponding to one of the first, second and third slots 36a, 36b, 36c.

Figure 3:
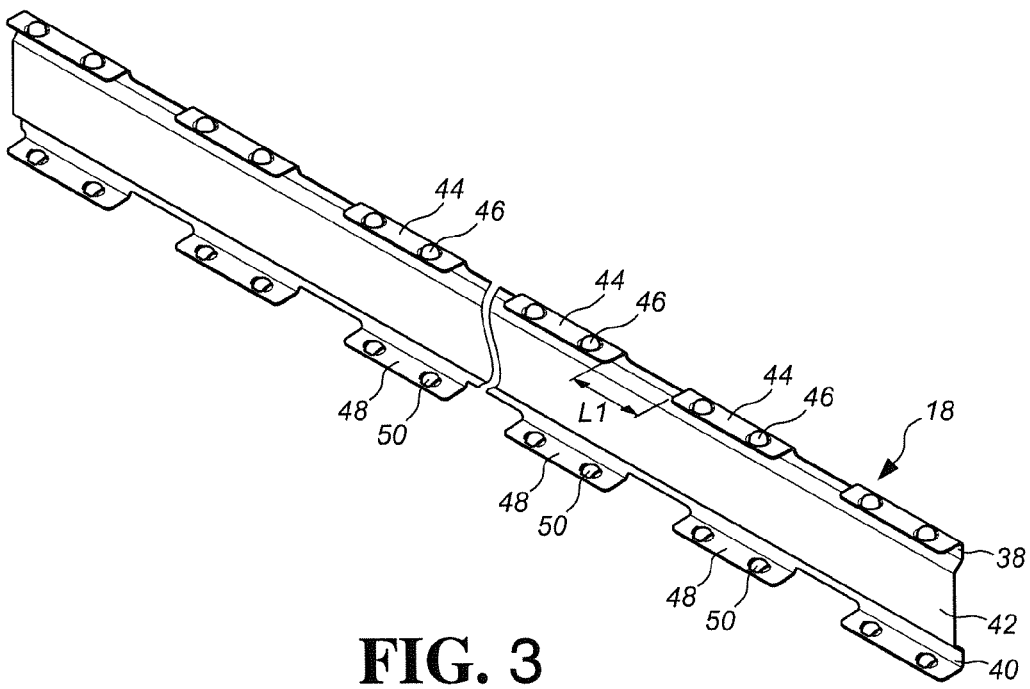
FIG. 3 is a perspective view to show the ball bearing retainer of the present invention.

The ball bearing retainer 18, as shown in FIG. 3, has an upper member 38, a bottom member 40 located corresponding to the upper member 38, and a connection member 42 connected to the upper and bottom members 38, 40. The ball bearing retainer 18 has a length, and the upper member 38 has a plurality of spaced upper retaining sections 44 located lengthwise along the ball bearing retainer 18. Each of the upper retaining sections 44 at least has an upper ball bearing 46, and a distance $L_1$ is defined between any adjacent upper retaining sections 44. The bottom member 40 has a length corresponding to that of the upper member 38 and has a plurality of spaced bottom retaining sections 48. Each of the bottom retaining sections 48 along the bottom member 40 has a plurality of bottom ball bearings 50. The upper ball bearings 46 are located between the top wall 30 of the inner rail 14 and the first bearing face 26a of the intermediate rail 12. The bottom ball bearings 50 are located between the bottom wall 32 of the inner rail 14 and the second bearing face 26b of the intermediate rail 12.

Figure 4:
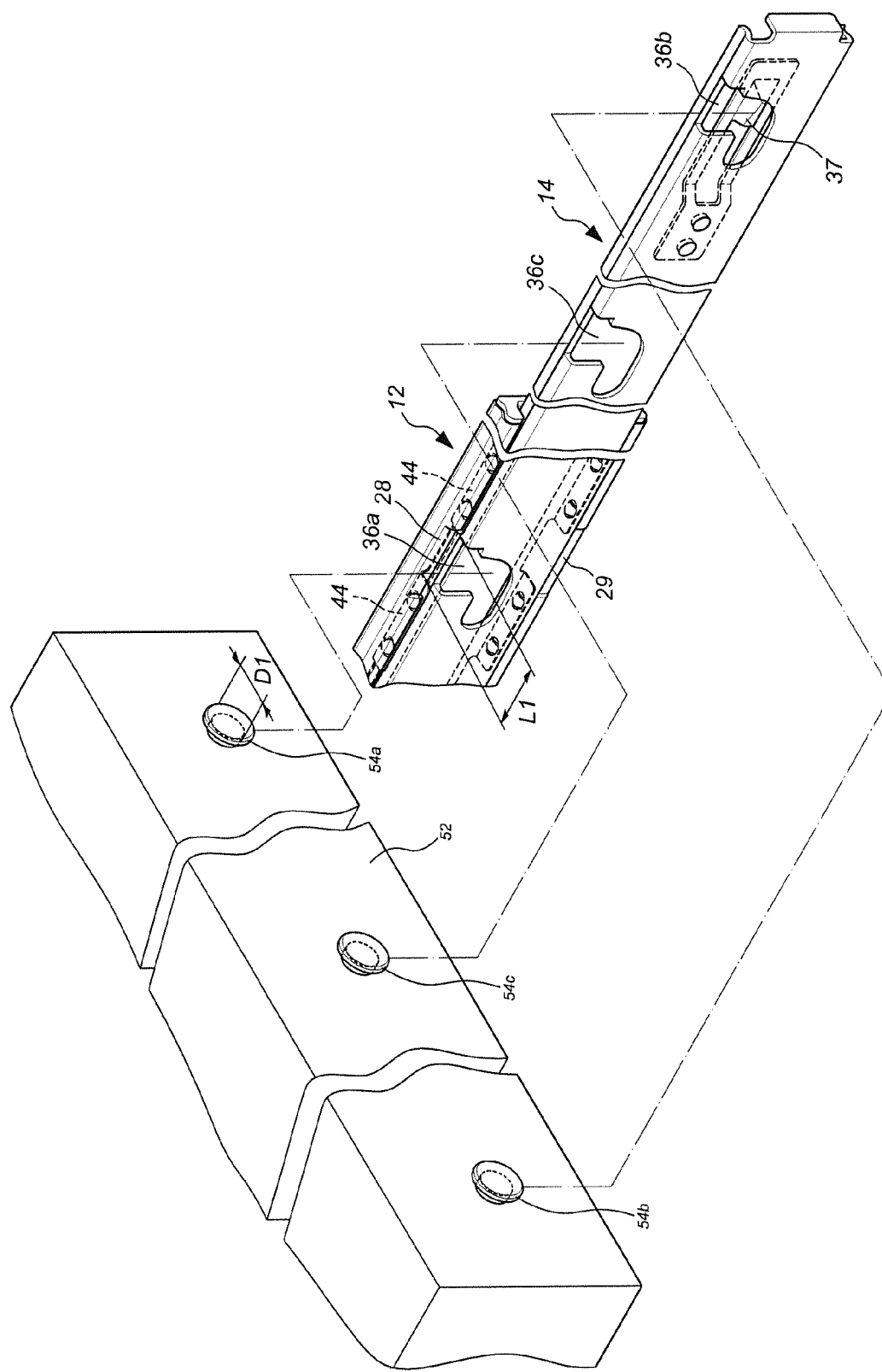
FIG. 4 shows the position relationship between the slide assembly and the installed member.

As shown in FIG. 4, the slide assembly is provided with an installed member 52 such as a chassis, the installed member 52 at least includes a first mount 54a, a second mount 54b and a third mount 54c located between the first and second mounts 54a, 54b. The maximum diameter $D_1$ of the first mount 54a of the installed member 52 is smaller than the distance $L_1$ between any adjacent upper retaining sections 44. The maximum diameter usually refers to the diameter of the circular head of the mount so that the first mount 54a can be inserted into and engaged with the first slot 36a of the inner rail 14 without being interfered by the ball bearing retainer 18. The second mount 54b can be inserted into and engaged with the second slot 36b of the inner rail 14 without being interfered by the ball bearing retainer 18 by using the engaging member 37. The third mount 54c can be inserted into and engaged with the third slot 36c of the inner rail 14.

Figure 5:
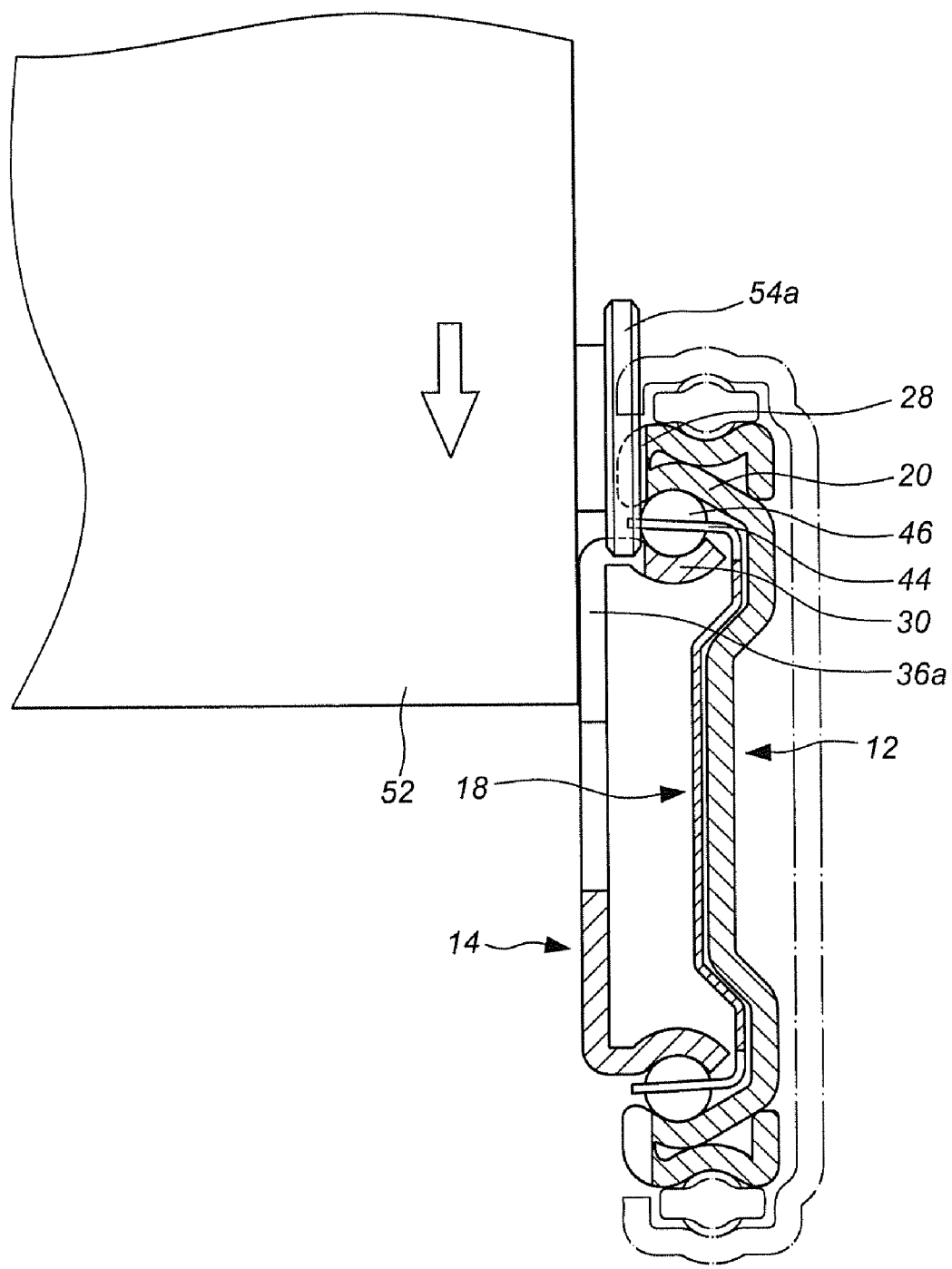
FIG. 5 shows a cross sectional view of the position relationship between the first mount of the installed member and the slide assembly.
Figure 6:
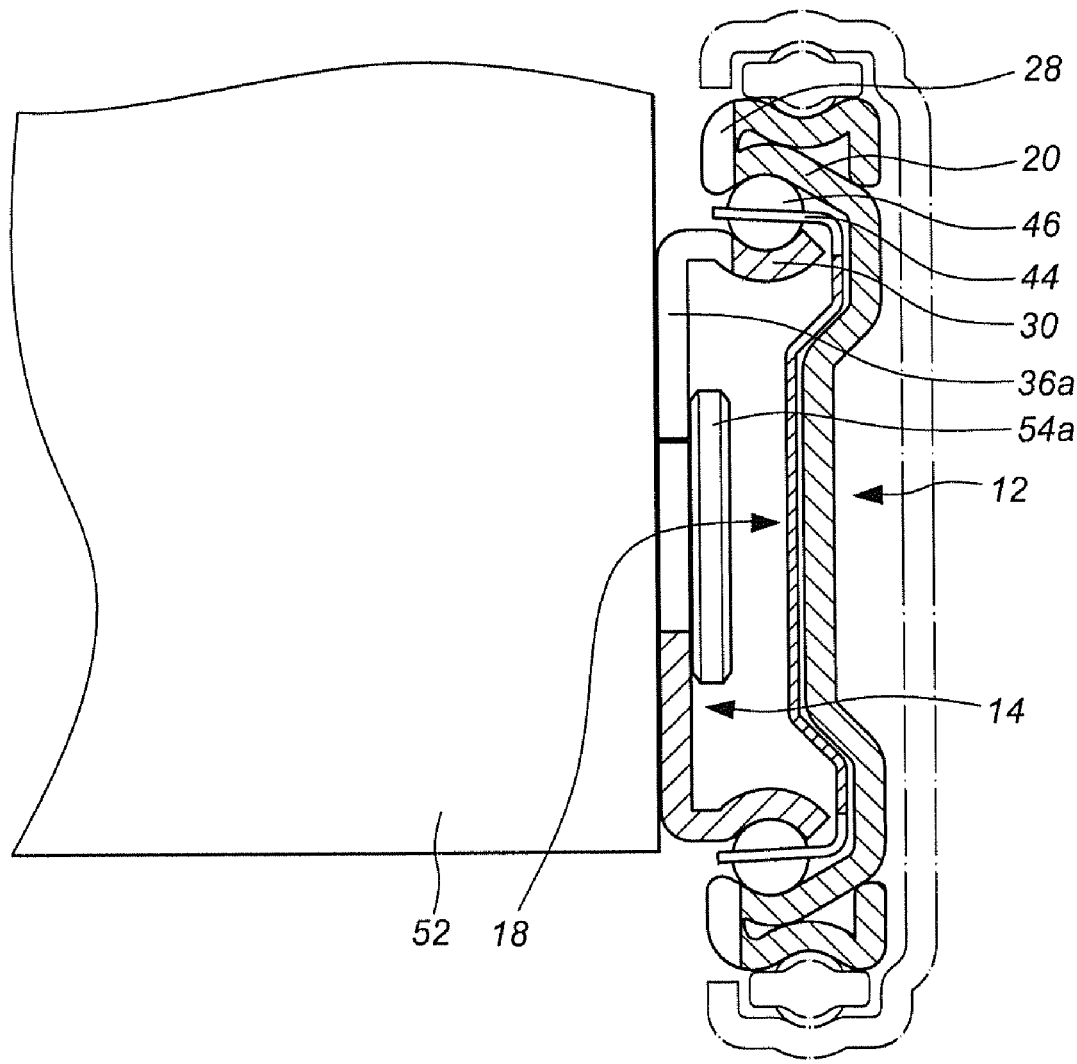
FIG. 6 is a cross sectional view to show that the installed member is installed to the slide assembly of the present invention.

FIGS. 5 and 6 show the engagement of the installed member 52 with the inner rail 14. When the inner rail 14 is pulled out relative to the intermediate rail 12 to an extension position, the first slot 36a of the inner rail 14 is located corresponding to the first notch 28 of the first wall 20 of the intermediate rail 12. The ball bearing retainer 18 is moved to make the first notch 28 of the intermediate rail 12 and the first slot 36a of the inner rail 14 be located between any two of the upper retaining sections 44, so that the first mount 54a of the installed member 52 extends through the first notch 28 of the intermediate rail 12 and yields the upper retaining sections 44 of the ball bearing retainer 18 and enters into the first slot 36a of the inner rail 14 to be positioned. By this way, the installed member 52 is connected with the inner rail 14, the upper and bottom members 38, 40 are located symmetrically with the upper and bottom ball bearings 46, 50 and located between the inner and intermediate rails 14, 12. Eventually, the installed member 52 is connected to the inner rail 14 of the slide assembly. By the firm support of the inner and intermediate rails 14, 12, the installed member 52 can be smoothly moved.

The present invention does not reduce the length of the upper member 38 of the ball bearing retainer 18, thanks to the distance between any two of the upper retaining sections 44. The first mount 54a of the installed member 52 can be engaged with the inner rail 14 without being interfered by the ball bearing retainer 18. When the size of the chassis changes, the ball bearing retainer 18 remains the same, only adjusting the distance between the ball bearing retainer 18 and the chassis and using the distance between any two of the upper retaining sections 44, the chassis can be connected to the mounts. Besides, the ball bearing retainer 18 separates the upper and bottom retaining sections 44, 48 and allows the slide assembly to be operated on both left and right sides. Furthermore, the position relationship between the intermediate rail 12, the inner rail 14 and the ball bearing retainer 18 reinforces the support to the installed member 52 and allows different sizes of the chasses to be connected to the slide assembly. The installed member 52 can also be quickly installed to the slide assembly.

While we have shown and described the embodiment in accordance with the present invention, it should be clear to those skilled in the art that further embodiments may be made without departing from the scope of the present invention.

What is claimed is:

1. A slide assembly with quick-mount system, comprising:
   an outer rail;
   an intermediate rail slidably connected to the outer rail and having a first wall, a second wall located corresponding to the first wall, and a third wall connected to the first and second walls, the first wall having a first bearing face and a first notch, the second wall having a second bearing face;
   at least one inner ball bearing set located between the outer rail and the intermediate rail;
   an inner rail having a top wall, a bottom wall located corresponding to the top wall, and a side wall connected to the top and bottom walls, the top wall of the inner rail located corresponding to the first bearing face of the first wall of the intermediate rail, the bottom wall of the inner rail located corresponding to the second bearing face of the second wall of the intermediate rail, the top wall of the inner rail having a first slot and a second slot, each of the first and second slots extending to a portion of the side wall of the inner rail;
   an installed member at least having a first mount and a second mount;
   a ball bearing retainer having an upper member, a bottom member located corresponding to the upper member, and a connection member connected to the upper and bottom members, the ball bearing retainer having a length, the upper member having a plurality of spaced upper retaining sections located lengthwise along the ball bearing retainer, each of the upper retaining sections at least having an upper ball bearing, a distance between any adjacent upper retaining sections being larger than a maximum diameter of the first mount of the installed member, the bottom member having a length corresponding to that of the upper member and having a plurality of spaced bottom retaining sections, a plurality of bottom ball bearings connected to each of the bottom retaining sections located along the bottom member, the upper ball bearings located between the top wall of the inner rail and the first bearing face of the intermediate rail, the bottom ball bearings located between the bottom wall of the inner rail and the second bearing face of the intermediate rail, and
   wherein when the inner rail is pulled out relative to the intermediate rail to an extension position, the first slot of the inner rail is located corresponding to the first notch of the first wall of the intermediate rail and is located between any two of the upper retaining sections of the ball bearing retainer, so that the first mount of the installed member extends through the first notch of the intermediate rail and yields the ball bearing retainer and enters into the first slot of the inner rail to be positioned.

2. The slide assembly as claimed in claim 1, wherein the inner rail has a third slot which is located between the first and second slots, the installed member has a third mount located between the first and second mounts, the third mount is inserted into the third slot of the inner rail and positioned.

3. The slide assembly as claimed in claim 1, wherein the second wall of the intermediate rail has a second notch which is located corresponding to the first notch of the first wall.

* * * * *